(12) United States Patent
Katayama et al.

(10) Patent No.: US 6,487,691 B1
(45) Date of Patent: Nov. 26, 2002

(54) REED-SOLOMON DECODER

(75) Inventors: Yasunao Katayama, Hachiouji (JP); Sumio Morioka, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/401,051

(22) Filed: Sep. 22, 1999

(30) Foreign Application Priority Data

Sep. 22, 1998 (JP) .......................................... 10-268493

(51) Int. Cl.$^7$ ............................................. H03M 13/00
(52) U.S. Cl. ..................................... 714/784; 714/785
(58) Field of Search ................................ 714/755, 795, 714/796, 784, 768, 772, 805, 782, 762, 6, 764; 702/189; 708/446

(56) References Cited

U.S. PATENT DOCUMENTS

| | | | | |
|---|---|---|---|---|
| 4,845,714 A | * | 7/1989 | Zook | 714/755 |
| 5,226,043 A | * | 7/1993 | Pughe, Jr. et al. | 714/768 |
| 5,343,481 A | * | 8/1994 | Kraft | 714/782 |
| 5,610,929 A | * | 3/1997 | Yamamoto | 714/785 |
| 5,983,383 A | * | 11/1999 | Wolf | 714/755 |
| 6,275,965 B1 | * | 8/2001 | Cox et al. | 714/755 |

FOREIGN PATENT DOCUMENTS

| | | | | |
|---|---|---|---|---|
| JP | PUPA 6-260943 | 6/1994 | .......... | H03M/13/00 |
| JP | PUPA 9-16423 | 1/1997 | .......... | G06F/11/10 |

* cited by examiner

*Primary Examiner*—Albert Decady
*Assistant Examiner*—Guy Lamarre
(74) *Attorney, Agent, or Firm*—Robert A. Walsh

(57) ABSTRACT

A Reed-Solomon decoder that can correct t errors or fewer which includes: a syndrome calculation circuit for calculating syndromes $S_j$ (J=0, 1, ..., 2t−1) using the first codeword $Y_i$ (i=0, 1, ..., n−1) (so-called received codeword) that may include errors; and a coefficient calculation circuit for, by using the syndromes $S_j$, calculating coefficients $\Lambda_k$ (k=1, ..., e) of an error-locator polynomial. The coefficients $\Lambda_k$ correspond in number to e estimated errors (e≦t<n). The syndromes $S_j$, calculating coefficients $Er_l$ (l=0, ..., ê) (ê can be as small as O(e)) of an error polynomial, and the coefficients $Er_l$ correspond in number to the e estimated errors. An error value calculation circuit for calculating error values $E_i$ by using the coefficients $Er_l$ of the error polynomial, and for using the coefficients $\Lambda_k$ of the error-locator polynomial to generate a signal concerning the error value $E_i$ to be used and an output circuit for using the first codeword $Y_i$ and the error value $E_i$, which correspond to the signal used to calculate the second codeword $W_i$ (so-called source codeword) in which the estimated errors are corrected. Since e≦t<n, and since there are e coefficients $\Lambda_k$ and e coefficients $Er_l$, the number of calculations performed by, and the sizes of the coefficient calculation circuit and the error value calculation circuit are reduced. Specifically, since the coefficient calculation circuit requires gate-consuming non-linear operations in order to calculate the coefficients $\Lambda_k$ and $Er_l$, the effects achieved by such a reduction are greater.

7 Claims, 1 Drawing Sheet

$\{\lambda_0, \ldots, \lambda_{e-1}\} = \{4,2,2,1\}$
$\{\lambda_0^*, \ldots, \lambda_{e-1}^*\} = \{4,3,1,1\}$

REED-SOLOMON DECODER

BACKGROUND

RS encoding and decoding can be defined as constituting a polynomial using the element in the Galois field $GF(2^m)$. The following codeword polynomial W(x) is calculated for (n, k) RS encoding where n denotes the number of code blocks and k denotes the number of information blocks (a test block is n−k=2t, where t is the maximum correctable number of symbols).

$$W(x)=M(x)x^{n-k}-R(x)$$

where

M(x): a polynomial using information symbols as coefficients;

R(x): a polynomial using parity symbols as coefficients;

$R(x)=M(x)x^{n-k}$ mod G(x); and

G(x): generator polynomial, $G(x)=(x-a^d)(x-a^{d-1}) \ldots (x-a^{d+2t-1})$.

In the above equation, a is defined by $GF(2^m)$ and is a solution of the m-order irreducible polynomial, i.e., a solution that satisfies $a^8+a^4+a^3+a^2+1=0$ when m=8. The polynomial W(x) can be divided by G(x) without yielding a remainder. The codeword polynomial W(x) can be a systematic codeword, compared with a method that calls for the direct multiplication of M(x) by G(x).

Generally, an LFSR (Linear Feedback Shift Register) is used for calculating the remainder of the $M(x)x^{n-k}$ by G(x). If one LFSR is used for the encoding one block, the LFSR has 2t constant multipliers and uses them (n−2t) times. Thus, 2(n−2t)t constant multiplications must be performed for the encoding.

The RS decoding is an operation used for estimating the original W(x) by using a received polynomial $$Y(x)=W(x)+E(x).$$

E(x) is a polynomial using an error symbol as a coefficient. Y(x) can also be expressed as follows, where $Y_i$ is a received codeword, $$Y(x)=Y_{n-1}x^{n-1}+Y_{n-2}x^{n-2}+\ldots Y_1x+Y_0.$$

The decoding methods are mainly (i) a method for using Y(x) to perform decoding in a time domain;

(ii) a method for using for a polynomial a remainder obtained by dividing Y(x) by G(x) (remainder-based decoding); and (iii) a method for performing a DFT (Discrete Fourier Transformation) for Y(x) to calculate 2t continuous spectra (syndromes) in a frequency domain (syndrome-based decoding).

According to the second and the third methods, information that depends only on an error (i.e. syndromes) is calculated by using the received information, and the location of the error is extracted. Thus, the number of terms is not O(n), but instead is reduced to O(t). Therefore, since generally t<n, a required circuit in the succeeding stages is small. The third method (iii) is generally used, and is further sorted into algebraic decoding and transform decoding. The prior art will now be described by using the two decoding methods that are most closely related to the present invention.

(a) Algebraic Decoding

Specifically, this method includes the following five steps that must be performed for decoding:

(i) calculating a syndrome by performing a DFT for a received codeword;

(ii) obtaining an error-locator polynomial and an error-evaluator polynomial by using the calculated syndrome;

(iii) calculating the solution for the error-locator polynomial in order to estimate the location of the error;

(iv) estimating an error value from the error-locator and the error-evaluator polynomial by using the Forney algorithm; and (v) correcting the error by using the received codeword and the error value.

In the calculation of the syndrome at step (i), the DFT calculation for $GF(2^m)$ need be performed. The DFT calculation is performed by substituting into Y(x) the elements 1, a, $a^2$, $a^3$ ... and $a^{2t-1}$ of $GF(2^m)$. That is, the syndrome is obtained by $S^0=Y(1)$
$S^1=Y(a)$
$S_2=Y(a^2)$
$S_3=Y(a^3)$
.
.
.
$S_{2t-1}=Y(a^{2t-1})$.

Since $W(a^i)=0$, $S_i=Y(a^i)=W(a^i)+E(a^i)=E(a^i)(i=0, \ldots, 2t-1)$.

The occurrence of an error in Y(x) can be determined by examining the syndromes to determine whether they are all 0. Since generally 2t arithmetic circuits are used n times to calculate the syndromes, 2nt constant multiplications are required.

Error correction using the syndromes is performed by estimating the number of errors using $S_i$. This is the calculation performed with E(x) that provides the calculated syndrome and that has a Hamming weight of t or less (i.e., that includes non zero terms equal to or less than t), and is the NP complete problem in general. However, the calculation method in the polynomial order is well known for RS code. At step (ii) the coefficient for the following error-locator polynomial is calculated by using the fact that the syndromes can be expressed as a linear combination of error values, and that symmetry exists relative to the exchange of orders of error locations.

Expression 1

$$\Lambda(x) = \prod_{k=0}^{t-1} (1 + a^{i_k} x)$$

Coefficients $\Lambda_t$ ... and $\Lambda_l$ for $\Lambda(x)$ are obtained by the following expression, wherein $L_0$ is defined as 1.

Expression 2

$$\begin{bmatrix} S_0 & S_1 & \ldots & S_{t-1} \\ S_1 & S_2 & \ldots & S_t \\ \vdots & \vdots & & \vdots \\ S_{t-1} & S_{t-2} & \ldots & S_{2t-2} \end{bmatrix} \begin{bmatrix} \Lambda_t \\ \Lambda_{t-1} \\ \vdots \\ \Lambda_1 \end{bmatrix} = \begin{bmatrix} S_t \\ S_{t+1} \\ \vdots \\ S_{2t-1} \end{bmatrix}$$

The Peterson method, the Berlekamp-Massey (BM) method and the Euclid method are proposed for performing this calculation in the polynomial order. According to these methods, $O(t^3)$, $O(t^2)$ and $O(t^2)$ multiplications are respectively performed to calculate the coefficients of the error-locator polynomial. Since these calculations are not directly related to the subject of the present invention, however, no further explanation shall be given for them. For the details, see the referenced document 1, "Theory And Practice Of Error Control Codes," R. E. Blahut, Addison-Wesley 1984, or referenced document 2, "Coding Theory," Hideki Imai, Institute of Electronic Information Communication, 1990.

When the coefficients $\Lambda_t \ldots$ and $\Lambda_l$ of the error-locator polynomial are obtained, at step (iii) an error location i is obtained by performing the calculations for the polynomial. Generally, $a^{-i}$ (i=0, 1, ..., n-1) are sequentially substituted into the error-locator polynomial, and the relation $\Lambda(a^{-i})=0$ is checked by using a sequential circuit (Chien Search). Since $\Lambda(x)$ is the t-order polynomial, t constant multiplications must be repeated n times (a total of nt constant multiplications).

At step (iv), the Forney algorithm is used to calculate the error value by employing the following error-evaluator polynomial $$\Omega(x)=S(x)\Lambda(x) \bmod x^{2t-1},$$

where $S(x)$ is the following polynomial having syndromes as coefficients:
Expression 3

$$S(x) = \sum_{i=0}^{2t-1} S_i x^i$$

The obtained error value $E_i$ is $$E_i=\Omega(a^{-i})/(\Lambda'(a^{-i})a^{-i}),$$

where $\Lambda'(x)$ represents the derivative of $\Lambda(x)$.

Finally, at step (v) the error is corrected. That is, $$W(x)=Y(x)+E(x)$$

Most of these calculations are performed as sequential steps using a sequential circuit, as previously mentioned. Specifically, steps (i) to (v) are sequentially performed, and at each step many processes are sequentially performed, including iterative calculations. The implementation of the RS decoder does not precipitate any problem in applications that has a relatively low data transfer rate. However, with a memory ECC application for which high through-put and low latency are required, a problem may arise concerning the processing speed.

The RS decoder requires only the linear calculation performed up to the acquisition of syndromes (step (i)), but for the following process to estimate the error location and error value, it requires multiple non-linear circuits. It is difficult to provide a small, fast circuit for the nonlinear calculation in the Galois field (a circuit for two-input multiplication, reciprocal calculation, etc.) using the basic logical function primitives (AND and XOR).

To resolve the problem concerning the processing speed, a combinational circuit can be provided. Actually, in BCH encoding, the part of the circuit used for calculating the coefficients of a polynomial is developed into a combinational circuit. The calculation expressions up to t=5 are represented, and an example for t=3 is disclosed in U.S. Pat. No. 5,343,481 However, in the design of the combinational circuit, a circuit sharing which is one of the design techniques that are frequently used in the design of sequential circuits is difficult. Therefore, unless the processing flow is so designed that the number of nonlinear operations is reduced, the number of nonlinear operating units required is increased in accordance with the number of iterative steps performed in a loop, a number that is increased in proportion to t, and the number of conditional branches in the loop. In addition, while in the BCH code only the error locations need be obtained, in the RS code not only the error locations but also the error values must be obtained. As a result, when t>1, the RS encoding uses more nonlinear operations than does the BCH encoding.

Because of the above described background, in most cases a conventional RS decoder is provided as a sequential circuit. In prior art, only when the maximum number of correctable symbols is small (t=1) the RS decoder is provided as a combinational circuit.

Specific problems will now be described that arise when algebraic decoding is implemented by using a combinational circuit.

(1) One problem arises when the Peterson method, the BM method or the Euclid method, which are frequently used to obtain the error-locator polynomial and the error-evaluator polynomial, are implemented as combinational circuits. Since the Peterson method provides a simple, direct method for the calculation of coefficients when the maximum number of correctable error symbol t is small (e.g., two), the Peterson method can be implemented by a combinational circuit. However, when the number of error symbols is increased, the size of the operations is increased as $O(e^3)$ when e is the actual number of error in the received codeword. Therefore, the Peterson method is implemented by using the combinational circuit, and circuits for the calculation of coefficient $\Lambda(x)$ must be prepared in a number equivalent to the error count, which is equal to or smaller than t, so that the size of the circuit is increased by the amount
Expression 4

$$\sum_{e=1}^{t} e^3 \sim O(t^4)$$

instead of $O(t^3)$. The BM method provides a calculation algorithm that requires only the calculation amount $O(t^2)$. However, since a plurality of conditional branches are included in a single loop, it is not easy to increase the processing speed by using the algorithm to implement the combinational circuit within a practical number of gate size. Especially for RS encoding, the number of required loops is double that required for BCH encoding (see referenced documents 1 and 2). While the Euclid method also requires only the calculation amount $O(t^2)$, it includes the division by a polynomial, so that the size of a combinational circuit required to implement this method is unrealistically large.

(2) If, for the estimation of an error value, following the Chien Search, paths are merely arranged in parallel to constitute a combinational circuit, n dividers have to be prepared for the Forney Algorithm for the calculation of the error value. In this case, not all the dividers are effectively used; actually, only the dividers equivalent in number to the error corrections t are actually used. In addition, even when the dividers are designed to be used in common, the size of the circuit is not reduced very much, whereas the decoding speed is lowered considerably. This occurs because a circuit for allocating dividers in accordance with the error location requires 2t n-bit multiplexers (t multiplexers each at the preceding and succeeding stages) and t priority encoders.

(b) Transform Decoding

In the present invention, for decoding. the following five steps are performed:
(i) calculation of syndromes by performing a DFT for received codeword;
(ii) calculation of coefficients for an error-locator polynomial by using the obtained syndromes;
(iii) reflexive calculation of the DFT elements of n errors without resolving the error-locator polynomial;
(iv) calculation of error values by performing an IDFT (Inverse DFT); and
(v) correction of the errors by using the received codeword and the error values.

The method in (a) is used for steps (i) and (ii). At step (iii) the DFT elements $E^*_i$ of the errors are obtained. Since the following relationship is established for the first 2t, $$E^*_i = E(a^i) = S_i (i=0, \ldots, 2t-1),$$

the high-order elements are calculated using Expression 5

$$E^*_i = \sum_{j=1}^{n-1} \Lambda_j E^*_{i-j}$$

where i=2t, ..., n−1.

At step (iv), an IDFT is performed by substituting $a^{-i}$ (i=0, ... n−1) into the polynomial that is defined by using $E^*_i$ as a coefficient. That is, $$E_i = E^*(a^{-i})$$

is used to calculate error value $E_i$.

The method described in (a) is performed at step (v).

Since a division circuit is not used for transform decoding, a problem precipitated by a division circuit, when method (a) is used to implement the combinational circuit, does not arise when method (b) is used. However, the following problems, in addition to the calculation of coefficient Λ(x), which is one of the problems that accompany the implementation of method (a), are encountered with method (b).

(1) While the same circuit in the sequential circuit can be iteratively used to calculate all the values $E_i$, n−2t circuits must be prepared for a combinational circuit. And since t 2-input multipliers are required for a single iteration, a total of t(n−2t) 2-input multipliers are required. In addition, since a recursive calculation is performed, i.e., a low-order calculation must be completed before a next-order calculation is begun, the calculation speed cannot be increased very much by implementing a combinational circuit.

(2) Since the error values are calculated after all the DFT elements for n errors are obtained from the syndromes, this algorithm is easily implemented by a combinational circuit, but for an IDFT, an enormous number of circuits must be used. That is, for an IDFT $n^2$ constant multipliers are required.

DESCRIPTION OF THE INVENTION

It is, therefore, one object of the present invention to provide a high-speed, low power consumption Reed-Solomon decoder.

It is another object of the present invention to constitute a Reed-Solomon decoder by using only a combinational circuit, and without using a sequential circuit.

It is an additional object of the present invention to provide a Reed-Solomon decoder having a circuit size that can actually be achieved.

To achieve the above objects, according to the present invention, a Reed-Solomon decoder that can correct t errors or fewer comprises: a syndrome calculation circuit for calculating syndromes $S_j$ (j=0, 1, ..., 2t−1) using the first codeword $Y_i$ (i=0, 1, ..., n−1) (so-called received codeword) that may include errors; a coefficient calculation circuit for, by using the syndromes $S_j$, calculating coefficients $\Lambda_k$ (k=1, ..., e) of an error-locator polynomial, the coefficients $\Lambda_k$ corresponding in number to e estimated errors (e≦t<n), and for, by using the syndromes $S_j$, calculating coefficients $Er_1$ (l=0, ..., ê) (ê can be as small as O(e)) of an error polynomial, the coefficients $Er_1$ corresponding in number to the e estimated errors; an error value calculation circuit for calculating error values $E_i$ by using the coefficients $Er_1$ of the error polynomial, and for using the coefficients $\Lambda_k$ of the error-locator polynomial to generate a signal concerning the error value $E_i$ to be used; and an output circuit for using the first codeword $Y_i$ and the error value $E_i$, which correspond to the signal used to calculate the second codeword $W_i$ (so-called source codeword) in which the estimated errors are corrected. Since e≦t<n, and since there are e coefficients $\Lambda_k$ and ê coefficients $Er_1$, the number of calculations performed by, and the sizes of the coefficient calculation circuit and the error value calculation circuit are reduced. Specifically, since the coefficient circuit is required to perform a nonlinear operation in order to calculate the coefficients $\Lambda_k$ and $Er_1$, the effects achieved by such a reduction are greater.

At least one of the syndrome calculation circuit, the coefficient calculation circuit, the error value calculation circuit and the output circuit is constituted by a combinational circuit, as will be described later. And as a result, the calculation speed is increased.

The coefficient calculation circuit is so designed that it includes a circuit for calculating, in the ascending order of e coefficients $\Lambda_w^{(e)}$ (w=1, ..., e) of an error-locator polynomial corresponding to the number e (e≦t) of errors by using the syndromes $S_j$ and coefficients $\Lambda_v^{(n-1)}$ (v=1, ..., e−1). By using this circuit in common, the size of the circuit can be limited.

The error value calculation circuit performs a calculation by using the element $a^i$ and the inverse element $a^{-i}$ of the Galois field $GF(2^m)$ corresponding to an error location i. In this case, by using a linear operation the calculation can be performed at high speed.

The coefficient calculation circuit may further use the coefficients $\Lambda_k$ of the error-locator polynomial, which correspond to the estimated errors e, in order to calculate the coefficients $Er_1$ of the error polynomial corresponding to the estimated errors e.

When a value of 0 is obtained by substituting the inverse element $a^{-i}$ of $GF(2^m)$ corresponding to the error location i, into the error-locator polynomial, the error value calculation circuit outputs a signal indicating the error values $E_i$ are to be used. In the other cases, the error value calculation circuit outputs a signal indicating the error values $E_i$ are not to be used.

The error value calculation circuit may include a constant multiplier for receiving the coefficients $Er_1$ of the error polynomial, and a constant multiplier for receiving the coefficients $\Lambda_k$ of the error-locator polynomial. When the element ad and the inverse element $a^{-1}$ of the Galois field $GF(2^m)$ corresponding to the error location i are used, because the values are constants, the multipliers are hardwired.

The thus arranged present invention can be applied for memory circuits for which high speed and low power consumption are demanded. These memory circuits are, for example, (i) a fast error correction circuit with low power consumption for extending the DRAM refresh time; (ii) a main memory redundancy circuit for a server for which high reliability and an adequate processing speed are desired; and (iii) a cache memory ECC circuit for which a high processing speed is desired.

BRIEF DESCRIPTION OF THE DRAWINGS

A better understanding of the invention will be obtained by reference to the detailed description below, in conjunction with the following drawings in which.

PREFERRED EMBODIMENTS OF THE INVENTION

Figure 1:
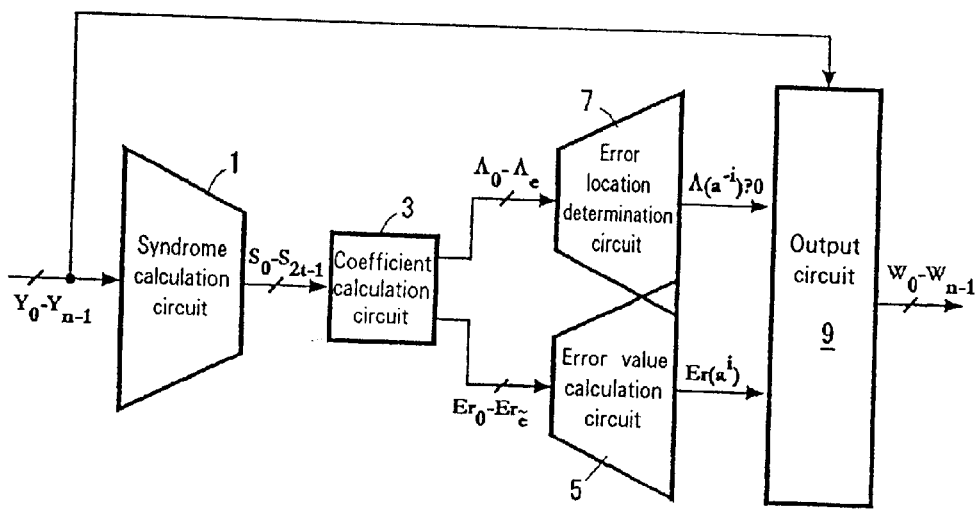
FIG. 1 is a functional block diagram illustrating a Reed-Solomon decoder according to the present invention.

FIG. 1 is a functional block diagram illustrating a Reed-Solomon decoder according to the present invention. Received codeword $Y_0$ to $Y_{n-1}$ are transmitted to a syndrome calculation circuit 1 and an output circuit 9. The syndrome calculation circuit 1 is connected to a coefficient calculation circuit 3. Syndromes $S_0$ to $S_{2t-1}$, which are obtained by the syndrome calculation circuit 1, are transmitted to the coefficient calculation circuit 3. The coefficient calculation circuit 3 is connected to an error value calculation circuit 5 and an error location determination circuit 7. The coefficients $\Lambda_0$ to $\Lambda_e$ of the error-locator polynomial, which are obtained by the coefficient calculation circuit 3, are transmitted to the error location determination circuit 7, and the coefficients $Er_0$ to $Er_e$ of the error polynomial are transmitted to the error value calculation circuit 5. It should be noted that e ($e \leq t < n$) is the estimated number of errors. The error value calculation circuit 5 is connected to the output circuit 9. The error value $Er(a^i)$ (i=0, . . . , n-1) obtained by the error value calculation circuit 5 is transmitted to the output circuit 9. The error location determination circuit 7 is also connected to the output circuit 9, and a signal ($\Lambda(a^{-i})$?0) that is obtained by the error location determination circuit 7 and that represents an error value $Er(a^{-i})$ to be used is transmitted to the output circuit 9. A signal of 1 is output when the coefficient $\Lambda(a^{-i})$ is 0, and a signal of 0 is output when the coefficient $\Lambda(a^{-i})$ is not 0. The output circuit 9 corrects the errors of the received codeword $Y_0$ to $Y_{n-1}$ by using the received error values $Er(a^{-i})$ and the signal representing the error value $Er(a^{-i})$ to be used, and outputs the obtained codeword $W_0$ to $W_{n-1}$.

The decoder in FIG. 1 is characterized in that the syndrome calculation circuit 1 (for performing the DFT calculation), the error location determination circuit 7 (for performing the IDFT calculation), the error value calculation circuit 5 (for performing the DFT calculation) and the output circuit 9 concentrate on the linear operation, and the coefficient calculation circuit 3 in the middle concentrates on the non-linear operation. As a result, the number of inputs/outputs of the non-linear operation unit can be reduced, and the number of non-linear operation units, which constitutes a bottle-neck that adversely affects the reduction of the circuit size, does not depend on n.

This occurs because of the following properties of the decoder constituted by a combinational circuit.

(1) As a common tendency, only a small number of gates is required for a linear operation unit (a constant multiplier and an adder), whereas a multitude of gates is required for a non-linear operation unit (a multiplier, inversion and a divider). Generally, in $GF(2^8)$, a linear operation circuit consists of several gates to several tens of gates, while a non-linear operation circuit has several hundreds to several thousands of gates.

(2) When a series of constant multiplications are performed in the $GF(2^m)$, they can be implemented at the same cost as that required for the preparation of one constant multiplier. However, when a non-linear operation is involved, the cost is increased, since a series of operations cannot be reduced to a single operation.

The arrangement of the present invention, wherein the linear operation units and the non-linear operation unit are provided separately and the number of inputs/outputs relative to the non-linear operation unit is reduced, can provide a local optimal solution in terms of the circuit size and the speed (the one that is considered close to the truly optimal solution). In addition, since the linear operation units and the non-linear operation unit are provided separately, automatic synthesization and verification can be easily performed by using computer programs.

The calculations to be performed by the individual components will now be described.

(1) Syndrome Calculation Circuit 1

The syndrome calculation circuit 1 performs the same calculation as in the prior art, i.e., performs the DFT calculation in $GF(2^m)$. This DFT calculation is performed by substituting elements 1, a, $a^2$, $a^3$, . . . and $a^{2t-1}$ of $GF(2^m)$ into received codeword polynomial $Y(x)=Y_{n-1}x^{n-1}+Y_{n-2}x^{n-2}+ \ldots Y_1x+Y_0$ that uses, as coefficients, received codeword $Y_i$ (i=0, . . . , n-1). In other words, $S^0=Y(1)$ $S_1=Y(a)$ $S_2=Y(a^2)$ $S_3=Y(a^3)$ $S_{2t-1}=Y(a^{2t-1})$ (2) Coefficient Calculation Circuit 3

As previously described, the coefficient calculation circuit 3 calculates coefficients $\Lambda_k^{(e)}$ (k=0, . . . , e) and coefficients $Er_1^{(e)}$ (1=0, . . . , e-1). First, an explanation will be given for the coefficients $\Lambda_k^{(e)}$ of the error-locator polynomial. The superscript (e) is used to indicate the number of errors is e.

(2-1) Calculation of Coefficients $\Lambda_k^{(e)}$ of Error-locator Polynomial

Expression 2 is calculated. Assume that t denotes the maximum number of errors that the decoder of the present invention can correct, and that e ($0 \leq e < t$) errors have occurred. Then, the matrix using $S_0$ to $S_{2t-2}$ in expression 2 can be represented as e×e matrix $T_e$:

Expression 6

$$T_e = \begin{bmatrix} S_0 & S_1 & \cdots & S_{e-1} \\ S_1 & S_2 & \cdots & S_e \\ \vdots & \vdots & & \vdots \\ S_{e-1} & S_e & \cdots & S_{2e-2} \end{bmatrix}$$

$$= \begin{bmatrix} I_{e-1} & 0 \\ [S_{e-1} & \cdots & S_{2e-3}]T_{e-1}^{-1} & 1 \end{bmatrix} \begin{bmatrix} T_{e-1} & S_{e-1} \\ & S_e \\ & \vdots \\ & S_{2e-3} \\ 0 & \Delta_e \end{bmatrix}$$

$I_{e-1}$ denotes a (e-1)×(e-1) identity matrix, $T_{e-1}$ denotes a matrix obtained by a one order reduction of $T_e$, $T_{e-1}^{-1}$ denotes the inverse matrix, and $\Delta_e$ denotes a value represented as follows.

Expression 7

$$\Delta_e = [S_{e-1} \ \ldots \ S_{2e-3}] T_{e-1}^{-1} \begin{bmatrix} S_{e-1} \\ S_e \\ \vdots \\ S_{2e-3} \end{bmatrix} + S_{2e-2}$$

Inverse matrix $T_e^{-1}$ is represented as follows by using these definitions.

Expression 8

$$T_e^{-1} = \begin{bmatrix} T_{e-1}^{-1} & \dfrac{T_{e-1}^{-1}}{\Delta_e} \begin{bmatrix} S_{e-1} \\ \vdots \\ S_{2e-3} \end{bmatrix} \\ 0 & \dfrac{1}{\Delta_e} \end{bmatrix} \begin{bmatrix} I_{e-1} & 0 \\ [S_{e-1} \ \ldots \ S_{2e-3}] T_{e-1}^{-1} & 1 \end{bmatrix}$$

Thus, expression 6 can be modified as follows.

Expression 9

$$\begin{bmatrix} \Lambda_e^{(e)} \\ \Lambda_{e-1}^{(e)} \\ \vdots \\ \Lambda_1^{(e)} \end{bmatrix} = T_e^{-1} \begin{bmatrix} S_e \\ S_{e+1} \\ \vdots \\ S_{2e-1} \end{bmatrix} =$$

$$\begin{bmatrix} T_{e-1}^{-1} \begin{bmatrix} S_e \\ \vdots \\ S_{2e-2} \end{bmatrix} + \dfrac{1}{\Lambda_e} \left\{ S_{2e-1} + [S_e \ \ldots \ S_{2e-2}] \begin{bmatrix} \Lambda_{e-1}^{(e-1)} \\ \vdots \\ \Lambda_1^{(e-1)} \end{bmatrix} \right\} \begin{bmatrix} \Lambda_{e-1}^{(e-1)} \\ \vdots \\ \Lambda_1^{(e-1)} \end{bmatrix} \\ \dfrac{S_{2e-1} + [S_e \ \ldots \ S_{2e-2}] \begin{bmatrix} \Lambda_{e-1}^{(e-1)} \\ \vdots \\ \Lambda_1^{(e-1)} \end{bmatrix}}{\Delta_e} \end{bmatrix}$$

Expression 9 indicates that when e errors have occurred the coefficients $\Lambda_k(e)$ of the error-locator polynomial can be calculated by using the coefficients $\Lambda_p^{(e-1)}, \Lambda_q^{(e-2)}, \ldots$ of the error-locator polynomial used when e−1 errors or fewer have occurred. That is, the syndromes and the obtained coefficient $\Lambda_p^{(e-1)}$ are used to calculate, for the ascending order of e, the coefficients $\Lambda_k^{(e)}$ that correspond to the e to be calculated. More specifically, a circuit need not be prepared for each e, and a circuit for calculating a coefficient corresponding to a smaller value of e can be used as part of a circuit for calculating a coefficient corresponding to a greater value of e. As a result, the size of the overall circuit can be reduced.

It should be noted that the matrix here differs in its symmetry from a well-known Teplitz matrix, and this very much complicates the problem.

As is described above, the coefficients $\Lambda_k^{(e)}$ of the error-locator polynomial are calculated in order beginning with e=1. The coefficient actually required is only the coefficient corresponding to the actual number of errors e. The number of errors can be estimated as being, for example, the maximum number of e for which $\det(T_e) \neq 0$. The coefficient calculation circuit 3 outputs, to the error location determination circuit 7, coefficients $\Lambda_k$ that are the coefficients $\Lambda_k^{(e)}$ of the error-locator polynomial corresponding to the number of estimated errors e.

The actual calculations up to e=3 are shown below with further reductions. For simplification, $\Lambda_0^{(r)}$ is normalized as $\Lambda_0^{(r)} = \det(T_r)$.

$\Lambda 1^{(1)} = S_1$
$\Lambda_0^{(1)} = S_0$
$\Lambda_2^{(2)} = \Lambda_1^{(1)} S_3 + S_2^2$
$\Lambda_1^{(2)} = \Lambda_0^{(1)} S_3 + \Lambda_1^{(1)} S_2$
$\Lambda_0^{(2)} = \Lambda 0^{(1)} S_2 + \Lambda 1^{(1)} S_1$
$\Lambda_3^{(3)} = \Lambda L_2^{(2)} S_5 + S_1 S_4^2 + S_3^3$
$\Lambda_2^{(3)} = \Lambda_1^{(2)} S_5 + \Lambda_2^{(2)} S_4 + S_0 S_4^2 + S_2 S_3^2$
$\Lambda_1^{(3)} = \Lambda_0^{(2)} S_5 + \Lambda_1^{(2)} S_4 \Lambda_2^{(2)} S_3$
$\Lambda_0^{(3)} = \Lambda_0^{(2)} S_4 + \Lambda_1^{(2)} S_3 + \Lambda_2^{(2)} S_2$ If $\Lambda_0^{(e)}$ is not normalized, it need not be transmitted to the error location determination circuit 7 since $\Lambda_0^{(e)}$ is 1.

(2-2;) Calculation of Coefficients $Er_1^{(e)}$ of Error Polynomial

The present invention defines a new error polynomial, with which the error value is obtained by substituting the coefficient into the polynomial and, unlike the Forney algorithm, without a division being required after the coefficient has been substituted into the polynomial, and which, unlike Transform decoding, does not require term O(n).

Specifically, when e=3 the error polynomial is represented as follows.

$$Er^{(3)}(x) = (\Lambda_1^{(3)}\Lambda_2^{(3)} + \Lambda_3^{(3)})^{-1}(S_0 x^3 + S_1 x^2 + (\Lambda_1^{(3)2} S_0 \Lambda_2^{(3)} S_0 + S_2)x + (\Lambda_2^{(3)}\Lambda_2^{(3)} S_0 + \Lambda_1^{(3)2} S_1 + \Lambda_1^{(3)} S_2))$$

Therefore, $Er_3^{(3)} = (\Lambda_1^{(3)}\Lambda_2^{(3)} + \Lambda_3^{(3)})^{-1} S_0$
$Er_2^{(3)} = (\Lambda_1^{(3)}\Lambda_2^{(3)} + \Lambda_3^{(3)})^{-1} S_1$
$Er_1^{(3)} = (\Lambda_1^{(3)}\Lambda_2^{(3)} + \Lambda_3^{(3)})^{-1}(\Lambda_1^{(3)2} S_0 + \Lambda_2^{(3)} S_0 + S_2)$
$Er_0^{(3)} = (\Lambda_1^{(3)}\Lambda_2^{(3)} + \Lambda_3^{(3)})^{-1}(\Lambda 2^{(3)}\Lambda_2^{(3)} S_0 + \Lambda_1^{(3)2} S_1 + \Lambda_1^{(3)} S_2))$.

When e=2, the error polynomial is as follows.

$$Er^{(2)}(x) = (\Lambda_0^{(2)} S_0 / \Lambda_1^{(2)}) x + (S_1^3 + S_0^2 S_3) / \Lambda_1^{(2)}.$$

Therefore, $Er_2^{(2)} = 0$
$Er_1^{(2)} = (\Lambda_0^{(2)} S_0 / \Lambda_1^{(2)})$
$Er_0^{(2)} = (S_1^3 + S_0^2 S_3) / \Lambda_1^{(2)}$.

When e=1, $Er^{(1)}(x) = S_0$. Therefore, $Er_1^{(1)} = 0$
$Er_0^{(1)} = S_0$.

Also in this case, only coefficients $Er_1^{(e)}$ corresponding to the number of errors e are transmitted as $Er_1$ to the error value calculation circuit 5.

An explanation will now be given of how the results are obtained. First, the following expression is established.

Expression 10

$$\begin{bmatrix} 1 & 1 & \ldots & 1 \\ a^{i_0} & a^{i_1} & \ldots & a^{i_{e-1}} \\ a^{i_0 \cdot 2} & a^{i_1 \cdot 2} & \ldots & a^{i_{e-1} \cdot 2} \\ \vdots & \vdots & & \vdots \\ a^{i_0 \cdot (e-1)} & a^{i_1 \cdot (e-1)} & \ldots & a^{i_{e-1} \cdot (e-1)} \end{bmatrix} \begin{bmatrix} E_0 \\ E_1 \\ \vdots \\ E_{e-1} \end{bmatrix} = \begin{bmatrix} S_0 \\ S_1 \\ \vdots \\ S_{e-1} \end{bmatrix}$$

wherein $A^{(e)}$ is a matrix before a matrix consisting of $E_0$ to $E_{e-1}$ is prepared. Here, superscript is used for (e) in order to indicate that this is a matrix when the number of errors is e. An explanation will also be given for $a^i{}_k$, whereof $a^i$ is the element of the Galois field $GF(2^m)$ corresponding to the error location i, with i representing the overall order, and $i_k$ being used to indicate the order of the codeword that contain errors. Since the total number of errors is e, k is defined as having the values 0 to e−1.

Since $i_0$ to $i_{e-1}$ are not the same, an inverse matrix of the matrix $A^{(e)}$ is provided, and thus a solution is provided for expression 10. That is, Expression 11

$$E_{i_k} = \det(A^{(e)})^{-1}\left(\sum_{j=0}^{e-1} \tilde{A}_{ji_k}^{(e)} S_j\right)$$

wherein k=0, . . . , e−1. The determinant of the denominator of expression 11 is called the Vandermonde determinant, and is represented by
Expression 12

$$\det(A^{(e)}) = \Pi_{j>k}(a^{ij} + a^{ik})$$

Further, a determinant obtained by adding $A_{ij}^{(e)}$ in expression with a superscripted "~" is a minor of $A^{(e)}$.

The equation can be solved if all the error locations are obtained. In this case, however, the calculation of $O(e^3)$ is added to the inverse matrix calculation and the error locations must be calculated in advance, so that the calculation of the error values and the error locations cannot be performed at the same time. As is shown by the results described above, the coefficients of the error-locator polynomial and the syndromes are needed to represent expression 11. The denominator and the numerator in expression 11 will be separately explained.

(a) Denominator in Expression 11

While taking into account that $$\Lambda_e^{(e)}, \Lambda_{e-1}^{(e)}, \ldots, \Lambda_1^{(e)}$$

is the elementary symmetric function of
Expression 13

$$a^{i_0}, a^{i_1}, \ldots, a^{i_{e-1}}$$

since the sum and the difference are the same in the Galois field, $\det(A^{(e)})$ is the symmetric function for expression 13. Therefore, $\det(A^{(e)})$ can be a function of $\Lambda_e^{(e)}, \Lambda_{e-1}^{(e)}, \ldots, \Lambda_1^{(e)}$. In other words, it can be written as $$\det(A^{(e)}) = f(\Lambda_e^{(e)}, \Lambda_{e-1}^{(e)}, \ldots, \Lambda_1^{(e)}).$$

For the proof, see "Algebra," B. L. Van Der Vaerden, Frederick Ungar Publishing Co., 1970.

For example, $$\det(A^{(2)}) = \Lambda_1^{(2)}$$

$$\det(A^{(3)}) = \Lambda_1^{(3)}\Lambda_2^{(3)} + \Lambda_3^{(3)}.$$

(b) Numerator in Expression 11

The calculation of the minor is a problem the numerator portion must contend with. A direct calculation is possible when e is a small number, but when e is increased, the calculation must be performed using a Schur function and a Young tableaux, referring to "Schur Function, Chiral Boson, And The Quantum-Hall-Effect Edge States," M. Stone, Phys. Rev. B 42, 8399 (1990).

Expression 14

$$\tilde{A}_{ji_k}^{(e)} = \Phi_{\{1,\ldots,1,\underbrace{0,\ldots,0}_{e-j}\}i_k} h(\Lambda_{1i_k}^{(e)}, \ldots, \Lambda_{e-1i_k}^{(e)})$$

The locations of the numerals enclosed by curly brackets { } represent the first row, the second row, . . . of the minor, reading from the right inside the curly brackets. The magnitude of the numeral represents the degree of incrementation of the order. The order of $A^{(e)}$ is incremented at a lower row. Since the minor ji is a determinant that excludes the j-th row and the i-th column of $A^{(e)}$, the order at the j-th and succeeding rows of the minor is incremented so that it is one higher than that of $A^{(e)}$. Therefore, j−1 0s are arranged from the right in the minor in expression 14, and e−j 1s are arranged at the j-th and the following rows of which the order is incremented so that it is one higher than that of $A^{(e)}$.

Expression 15

$$\Phi_{\{\lambda_0,\lambda_1,\ldots,\lambda_{e-1}\}i_k} = \begin{vmatrix} \Lambda_{\lambda_0^* i_k}^{(e)} & \Lambda_{\lambda_0^*+1 i_k}^{(e)} & \cdots & \Lambda_{\lambda_0^*+e-1 i_k}^{(e)} \\ \Lambda_{\lambda_1^*-1 i_k}^{(e)} & \Lambda_{\lambda_1^* i_k}^{(e)} & \cdots & \Lambda_{\lambda_1^*+e-2 i_k}^{(e)} \\ \vdots & \vdots & & \vdots \\ \Lambda_{\lambda_{e-1}^*-e+1 i_k}^{(e)} & \Lambda_{\lambda_{e-1}^*-e+2 i_k}^{(e)} & \cdots & \Lambda_{\lambda_{e-1}^* i_k}^{(e)} \end{vmatrix}$$

Figure 2:
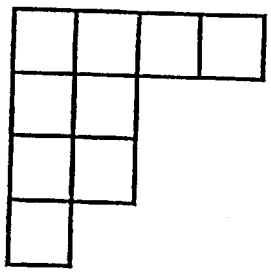
FIG. 2 is a diagram for explaining conjugate partitions.

$\{\lambda_0^*, \lambda_1^*, \ldots, \lambda_{e-1}^*\}$ is the conjugate partition of $\{\lambda_0, \lambda_1, \ldots, \lambda_{e-1}\}$. An explanation will be given by using an example in FIG. 2. In FIG. 2, when viewed from the top, there are 4, 2, 2 and 1 blocks, and when viewed from the left, there are 4, 3, 1 and 1 blocks. The top view represents the state $\{\lambda_0, \lambda_1, \ldots, \lambda_{e-1}\}$, and the left side view represents the state $\{\lambda_0^*, \lambda_1^*, \ldots, \lambda_{e-1}^*\}$.

Expression 16

$$h(\Lambda_{1i_k}^{(e)}, \Lambda_{2i_k}^{(e)}, \ldots, \Lambda_{e-1i_k}^{(e)})$$

is a determinant obtained by deleting from $A^{(e)}$ a row including the power $i_k$ of a and a row including the powers $(e-1)i_k$ of a.

Therefore, the minor can be represented as a function of
Expression 17

$$\Lambda_{1i_k}^{(e)}, \Lambda_{2i_k}^{(e)}, \ldots, \Lambda_{e-1i_k}^{(e)}$$

That is, it can be described by
Expression 18

$$\sum_{j=0}^{e-1} \tilde{A}_{ji_k}^{(e)} S_j = \sum_{j=0}^{e-1} g_j(\Lambda_{1i_k}^{(e)}, \Lambda_{2i_k}^{(e)}, \ldots, \Lambda_{e-1i_k}^{(e)}) S_j$$

Further, since
Expression 19

$$\Lambda_1^{(e)} = \Lambda_{1i_k}^{(e)} + a^{i_k}$$

$$\Lambda_2^{(e)} = \Lambda_{2i_k}^{(e)} + a^{i_k}\Lambda_{1i_k}^{(e)} \ldots$$

$$\Lambda_{e-1}^{(e)} = \Lambda_{e-1i_k}^{(e)} + a^{i_k}\Lambda_{e-2i_k}^{(e)}$$

the numerator portion can be represented using the power $i_k$ of a, $\Lambda_e^{(e)}, \Lambda_{e-1}^{(e)}, \ldots, \Lambda_1^{(e)}$, and $S_0, \ldots, S_{2e-1}$. To conclude,
Expression 20

$$E_{i_k} = Er(a^{i_k})$$

can be represented as a polynomial of the power $i_k$ of a, the coefficients for which are constituted $\Lambda_e^{(e)}, \Lambda_{e-1}^{(e)}, \ldots, \Lambda_1^{(e)}$, and $S_0, \ldots, S_{2e-1}$.

An explanation will now be given referring to an example for which of e=3. The error locations $i_k$ are $\alpha$, $\beta$ and $\gamma$. The values of $A^{(e)}$ are as follows.

Expression 21

$$A^{(e)} = \begin{bmatrix} 1 & 1 & 1 \\ a^\alpha & a^\beta & a^\gamma \\ a^{2\alpha} & a^{2\beta} & a^{2\gamma} \end{bmatrix}$$

Thus, the minors can be represented as follows.
Expression 22

$$\tilde{A}_{1a}^{(3)} = \begin{vmatrix} a^\beta & a^\gamma \\ a^{2\beta} & a^{2\gamma} \end{vmatrix} = \Phi_{\{1,1\}a} \begin{vmatrix} 1 & 1 \\ a^\beta & a^\gamma \end{vmatrix}$$

Expression 23

$$\tilde{A}_{2a}^{(3)} = \begin{vmatrix} 1 & 1 \\ a^{2\beta} & a^{2\gamma} \end{vmatrix} = \Phi_{\{1,0\}a} \begin{vmatrix} 1 & 1 \\ a^\beta & a^\gamma \end{vmatrix}$$

Expression 24

$$\tilde{A}_{3a}^{(3)} = \begin{vmatrix} 1 & 1 \\ a^\beta & a^\gamma \end{vmatrix} = \Phi_{\{0,0\}a} \begin{vmatrix} 1 & 1 \\ a^\beta & a^\gamma \end{vmatrix}$$

Since the conjugate partition of {1,1} {1,0} {0,0} is {2,0} {1,0} {0,0}, the Schur functions are represented as follows.
Expression 25

$$\Phi_{\{1,1\}a} = \begin{vmatrix} \Lambda_{2a}^{(3)} & \Lambda_{3a}^{(3)} \\ 0 & \Lambda_{0a}^{(3)} \end{vmatrix} = \Lambda_{2a}^{(3)}$$
$$= a^\alpha(a^\alpha + \Lambda_1^{(3)}) + \Lambda_2^{(3)}$$
$$= a^\beta \cdot a^\gamma$$

Expression 26

$$\Phi_{\{1,0\}a} = \begin{vmatrix} \Lambda_{1a}^{(3)} & \Lambda_{2a}^{(3)} \\ 0 & \Lambda_{0a}^{(3)} \end{vmatrix} = \Lambda_{1a}^{(3)}$$
$$= \Lambda_1^{(3)} + a^\alpha$$
$$= a^\beta + a^\gamma$$

Expression 27

$$\Phi_{\{0,0\}a} = \begin{vmatrix} \Lambda_{0a}^{(3)} & \Lambda_{1a}^{(3)} \\ 0 & \Lambda_{0a}^{(3)} \end{vmatrix} = 1$$

In expression 25 $\Phi_{\{1,1\}a} = a^\beta a^\gamma$ and in expression 26 $\Phi_{\{1,0\}a} = a^\beta + a^\gamma$ are introduced from expressions 22 and 23. Then,
Expression 28

$$\tilde{A}_{1\alpha}^{(3)} = (a^\alpha(a^\alpha + \Lambda_1^{(3)}) + \Lambda_2^{(3)})(a^\beta + a^\gamma) = (a^\alpha(a^\alpha + \Lambda_1^{(3)}) + \Lambda_2^{(3)})(\Lambda_1^{(3)} + a^\alpha)$$

Expression 29

$$\tilde{A}_{2\alpha}^{(3)} = (\Lambda_1^{(3)} + a^\alpha)(a^\beta + a^\gamma) = (\Lambda_1^{(3)} + a^\alpha)^2$$

Expression 30

$$\tilde{A}_{3\alpha}^{(3)} = a^\beta + a^\gamma = \Lambda_1^{(3)} + a^\alpha$$

are obtained. Therefore, $$E_a = (\Lambda_1^{(3)} \Lambda_2^{(3)} + \Lambda_3^{(3)})^{-1} \{(a^\alpha(a^\alpha + \Lambda_1^{(3)}) + \Lambda_2^{(3)})(a^\alpha + \Lambda_1^{(3)})S_0 + (a^\alpha + \Lambda_1^{(3)})^2 S_1 + (a^\alpha + \Lambda_1^{(3)})S_2\}.$$

Thus, the expression obtained by substituting x into $a^\alpha$ in the above expression is the expression for the error polynomial (e=3). It should be noted that this is an operation in the Galois field.

(3) Error Value Calculation Circuit 5

The error value calculation circuit 5 receives coefficients $Er_0$ to $Er_{\tilde{e}}$ of error polynomial Er(x). The error values are obtained by substituting the element $a^i$ (i=0, ..., n−1) in $GF(2^m)$ into x in error polynomial Er(x), which is constituted by the coefficients $Er_0$ to $Er_{\tilde{e}}$. That is, $$E_i = Er(a^i),$$

and a DFT is performed. Since $E_i$ is calculated for all "i"s (0 to n−1), $E_i$ is obtained even for a location whereat no error is present. Therefore, the calculation performed by the error location determination circuit 7, which will be described later, is required to disable invalid values. Since $a^i$ is a constant value for each i, it is hard-wired, and a constant multiplier for receiving the coefficients $Er_0$ to $Er_{\tilde{e}}$ is used.

(4) Error Location Determination Circuit 7

The error location determination circuit 7 receives coefficients $\Lambda_0$ to $\Lambda_e$ of error-locator polynomial $\Lambda(x)$. The error locations can be designated using the following calculation that includes an IDFT. That is, $\Lambda(a^{-1})$?0. At the error location i, a is the inverse element in $GF(2^m)$, and $\Lambda(a^{-i})$?0 means that when, as the result of a comparison, $\Lambda(a^{-i})=0$, a "1" is output, while in other cases, a "0" is output. The "1" means that the output $E_i$ of the error value calculation circuit 5 is to be used, and the "0" means that $E_i$ is not to be used. In this case also, $a^{-i}$ is hard-wired, and a constant multiplier for receiving the coefficients $\Lambda_0$ to $\Lambda_e$ is used.

(5) Output Circuit 9

The output circuit 9 outputs codeword $W_0$ to $W_{n-1}$ for which errors have been corrected. At this time, $Er(a^i) \cdot (\Lambda(a^{-i})?0)$ is executed. As is described in the subdivision of the background, since W(x)=Y(x)+E(x), $Er(a^i) \cdot (\Lambda(a^{-i})?0)$ and $Y_i$ are added together (XORed), and the codeword $W_i$ for which errors have been corrected can be obtained.

The above embodiment is merely an example, and can be modified in various ways. For example, in this embodiment the error location determination circuit 7 and the error value calculation circuit 5 are shown as separate functional blocks, but these circuits can be integrally formed. Further, the output circuit 9 can also be integrally formed with these circuits. And in addition, when n or t is a very large number, one part of the circuit can be formed as a sequential circuit. For since the circuit arrangement of the present invention is very symmetric, a combinational circuit can be easily changed to a sequential circuit. Furthermore, while in this embodiment the coefficient calculation circuit 3 merely estimates the number of errors, a circuit can be provided that will actually count the number of errors.

In summary, a high-speed, low power consumption Reed-Solomon decoder can be provided for which the parallel processing speed is increased. Further, since components such as a clock and a latch and a control circuit are not required, power consumption can be reduced.

In addition, a Reed-Solomon decoder can be constituted by using only a combinational circuit, without a sequential circuit being used.

Even when the combinational circuit is used, a Reed-Solomon decoder having a circuit size that actually be achieved.

The circuits can be generated and optimized more easily than it is in the prior art by using computer programs.

A person understanding this invention may now conceive of alternative structures and embodiments or variations of the above. All of those which fall within the scope of the claims appended hereto are considered to be part of the present invention.

What is claimed is:

1. A Reed-Solomon decoder that can correct t errors or fewer comprising:

a syndrome calculation circuit for calculating syndromes $S_j$ (J=0, 1, . . . , 2t−1) using the first codeword $Y_i$ (i=0, 1, . . . , n−1) that may include errors;

a coefficient calculation circuit for, by using said syndromes $S_j$, calculating coefficients $\Lambda_k$ (k=1, . . . , e) of an error-locator polynomial, said coefficients $\Lambda_k$ corresponding to e estimated errors (e≦t<n), and for, by using said syndromes $S_j$, calculating coefficients $Er_1$ (1=0, . . . , ê) (ê can be as small as O(e)) of a single error polynomial, said coefficients $Er_1$ corresponding to said e estimated errors;

an error value calculation circuit for calculating error values $E_i$ by using said coefficients $Er_1$ of said error polynomial, and for using said coefficients $\Lambda_k$ of said error-locator polynomial to generate a signal concerning said error value $E_i$ to be used; and an output circuit for using said first codeword $Y_i$ and said error value $E_i$, which correspond to said signal used to calculate the second codeword $W_i$ in which said estimated errors are corrected.

2. The Reed-Solomon decoder according to claim 1, wherein at least one of said syndrome calculation circuit, said coefficient calculation circuit, said error value calculation circuit and said output circuit is constituted by a combinational circuit.

3. The Reed-Solomon decoder according to claim 1, wherein said coefficient calculation circuit includes a circuit for calculating, in the ascending order of e, coefficients $\Lambda_w^{(e)}$ (w=1, . . . , e) of an error-locator polynomial that correspond to the number e (e≦t) of errors by using said syndromes $S_j$ and coefficients $\Lambda_v^{(e-1)}$ (v=1, . . . , e−1).

4. The Reed-Solomon decoder according to claim 1, wherein said coefficient calculation circuit further uses said coefficients $\Lambda_k$ of said error-locator polynomial, which correspond to said estimated errors e, in order to calculate said coefficients $Er_1$ of said error polynomial corresponding to said estimated errors e.

5. The Reed-Solomon decoder according to claim 4, wherein, when a value of 0 is obtained by substituting said inverse element $a^{-i}$ of $GF(2^m)$ corresponding to said error location i, into said error-locator polynomial, said error value calculation circuit outputs a signal indicating said error values $E_i$ are to be used, and when other values are obtained, outputs a signal indicating said error values $E_i$ are not to be used.

6. The Reed-Solomon decoder according to claim 1, wherein said error value calculation circuit performs a calculation by using the element $a^i$ and the inverse element $a^{-i}$ of the Galois field $GF(2^m)$ that corresponds to an error location i.

7. The Reed-Solomon decoder according to claim 6, wherein said error value calculation circuit includes a constant multiplier for receiving said coefficients $Er_1$ of said error polynomial, and a constant multiplier for receiving said coefficients $\Lambda_k$ of said error-locator polynomial.

* * * * *